(12) United States Patent  (10) Patent No.: US 6,709,545 B2
Iida  (45) Date of Patent: Mar. 23, 2004

(54) SUBSTRATE PROCESSING APPARATUS AND SUBSTRATE PROCESSING METHOD

(75) Inventor: Naruaki Iida, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/035,122

(22) Filed: Jan. 4, 2002

(65) Prior Publication Data
US 2002/0092615 A1 Jul. 18, 2002

(30) Foreign Application Priority Data
Jan. 15, 2001 (JP) ........................................ 2001-006312

(51) Int. Cl.⁷ .................... C23F 01/00; H01L 02/306
(52) U.S. Cl. .................. 156/345.31; 118/719; 414/935; 414/939
(58) Field of Search ...................... 156/345.31; 118/719; 414/217, 935, 939; 204/298.23, 298.25, 298.26, 298.27, 298.35

(56) References Cited

U.S. PATENT DOCUMENTS

| | | | |
|---|---|---|---|
| 4,836,905 A | * 6/1989 | Davis et al. ........... | 204/298.25 |
| 5,826,129 A | 10/1998 | Hasebe et al. | |
| 5,928,390 A | 7/1999 | Yaegashi et al. | |
| 6,190,104 B1 | * 2/2001 | Ikeda et al. ........... | 414/217 |
| 6,402,401 B1 | * 6/2002 | Ueda et al. ........... | 396/611 |
| 2001/0050146 A1 | * 12/2001 | Shimeno et al. ........ | 156/345 |

* cited by examiner

Primary Examiner—Parviz Hassonzadeh
Assistant Examiner—Karla Moore
(74) Attorney, Agent, or Firm—Oblon, Spivak, McClelland, Maier & Neustadt, P.C.

(57) ABSTRACT

In order to alleviate the affect of particles generated during operation of an elevation mechanism of a substrate conveyer means on the substrate that is transported in a substrate processing apparatus, a partition wall having a slit-like hole is provided in a casing that forms the outer housing of the elevation mechanism, whereby the casing is divided into a first chamber and a second chamber. A conveyer main unit holding a wafer is fixed to a rod-like support member. The support member has its end supported by a guide shaft. The guide shaft and a driving mechanism to move the support member upwards and downwards are provided in the first chamber. The support member descends and ascends along the guide shaft. A fan is disposed in the second chamber. A discharge outlet is formed at the bottom plane of the second chamber. By driving the fan, the atmosphere in the first chamber is attracted via the hole of the partition wall, whereby particles generated during the elevation of the conveyer main unit are discharged from the discharge outlet via the second chamber.

23 Claims, 14 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and substrate processing method to apply a process such as application of a resist agent, exposure and development on the surface of a substrate such as a semiconductor wafer or liquid crystal display substrate.

2. Description of the Background Art

The process of forming a circuit pattern on the surface of semiconductor wafers, liquid crystal display substrates (LCD substrate) and the like includes a wide range of steps. In a substrate processing apparatus, a dedicated processing unit is provided for each step. The system is constituted by a combination of a plurality of these units. The substrate to be processed is moved between each unit by conveyer means. For example, a resist film of a predetermined pattern is formed on a substrate processed by a substrate processing apparatus.

The structure and operation of a conventional substrate processing apparatus shown in FIG. 16 will be described hereinafter. The substrate processing apparatus includes, in the order from the carry-in side of a substrate towards the back side, a cassette station 1A, a processing block 1B, an interface unit 1C and an exposure device 1D.

A wafer cassette C in which a wafer W is stored is carried into the substrate processing apparatus from cassette station 1A. A wafer deliver means not shown is provided between cassette station 1A and processing block 1B. Wafer W is transferred from cassette station 1A to processing block 1B by the wafer deliver means.

Referring to processing block 1B, a rack unit 12 is disposed at the front side, left side and rear side about main conveyer means 10, viewed from the cassette station 1A side. An agent processing unit 13 is arranged at the right side. Main conveyer means 10 includes a main arm 11 that can move forward and backward, up and down, and rotatable in the horizontal direction. In each rack unit 12, a plurality of processing units such as a unit for a heating process and a unit for a cooling process are stacked in a plurality of stages. Agent processing unit 13 includes a unit for application, a unit for development, and the like.

Interface unit 1C functions to deliver wafer W between main conveyer means 10 and exposure device 1D.

Main conveyer means 10 will be described in detail here. Main conveyer means 10 includes a rotary table that can be rotated for a predetermined angle (θ), and a base elevation mechanism disposed on this rotary table. The base includes an arm 11 that can move forward and backward. Wafer W is held by arm 11. In the delivery of wafer W between respective units, the base with the forward and backward mechanism and elevation mechanism rotates at a predetermined angle on the rotary table in an integral manner.

Although not shown, the elevation mechanism of main conveyer means 10 includes a guide shaft that guides the upward and downward movement of arm 11. The frequent up and down movement of arm 11 along the guide shaft causes the surface of the guide shaft to be subjected to friction by arm 11. The guide shaft is a member that has the high possibility of producing particles among the members constituting main conveyer means 10. Therefore, during the rotation of main conveyer means 10, minute contaminants or particles generated by the guide shaft may float out to the atmosphere. The wiring for the power and control of the elevation mechanism of main conveyer means 10 must be arranged so as to withstand the rotary movement since the base thereof including the forward and backward mechanism and elevation mechanism is rotated on the rotary table integrally. There is a problem that the space for installment thereof is increased.

To overcome such problems, the inventor of the present application is studying the structure of the transportation means for wafer W such as that shown in FIG. 17. Referring to FIG. 17, a pair of elevation mechanisms 14 are provided so as to sandwich a shutter unit 16 of agent processing unit 15 stacked in a plurality of stages. A conveyer main unit 18 with arm 11 is supported by a support member 17. The pair of elevation mechanisms 14 include a guide shaft to guide the up and down movement of support member 17. Elevation mechanism 14 raises and lowers conveyer main unit 18 via supporting member 17.

Conveyer main unit 18 includes a rotation mechanism to rotate arm 11 by a predetermined angle (θ), and a forward and backward mechanism to move arm 11 forward and backward. Accordingly, wafer W held by arm 11 can be conveyed to another processing unit (a processing unit other than agent processing unit 15 in the drawing) located around conveyer main unit 18.

Since the rotation mechanism and elevation mechanism are provided separated from each other according to the above-described structure, the wiring arrangement is simplified.

However, the conveyer means of FIG. 17 has the pair of elevation mechanism 14 provided in the proximity of shutter unit 16 of agent processing unit 15. When shutter 16 opens at the time of delivery of wafer W, the wind flow generated by the elevation or forward or backward movement of conveyer main unit 18 will blow up the particles generated at elevation mechanism 14. There is a possibility that these floating particles will enter agent processing unit 15.

SUMMARY OF THE INVENTION

An object of the present invention is to provide a substrate processing apparatus and a substrate processing method that can prevent intrusion of particles generated in accordance with the operation of an elevation mechanism provided in the transportation means of a substrate into the processing unit.

According to an aspect of the present invention, a substrate processing apparatus includes a processing unit applying a process on a substrate carried into a processing vessel through a conveyer inlet, a conveyer base provided so as to face the conveyer inlet, and having an arm that can move forward and backward to deliver a substrate with respect to the processing unit through the conveyer inlet, a casing having an opening elongated in the vertical direction, a support member extending inside and outside the casing through the opening to support the conveyer base outside the casing, an elevation mechanism provided in the casing to move the support member upward and downward, and discharge means for discharging gas in the casing.

According to such a structure, the elevation mechanism that has the high possibility of generating particles among the members associated with the transportation of a substrate is enclosed by a casing. Also, discharge means is provided in the casing. Therefore, particles generated at the elevation mechanism at the time of the up and down movement of the conveyer base can be prevented from moving towards the conveyer inlet of the agent processing unit.

In a preferable embodiment, the casing includes a first chamber and a second chamber divided by a partition wall having a vent hole. The first chamber includes the opening through which the support member passes. The elevation mechanism is disposed in the first chamber. The discharge means is disposed in the second chamber. Accordingly, the particles generated in the first chamber can be attracted to the second chamber through the vent hole. Then, the particles can further be discharged outside.

In the above case, the partition wall is a perpendicular wall extending, for example, in the vertical direction. The vent hole is a vertical slit of a length corresponding to the distance of the up and down movement of the support member. Accordingly, particles can be discharged from the entire site that readily generates particles such as the guide shaft included in the elevation mechanism. This is particularly advantageous when processing units are stacked in a plurality of stages so that the elevation frequency of the conveyer base is high. The casing may be provided in a pair with the conveyer inlet of the processing unit therebetween.

In an embodiment of the present invention, the discharge means includes a discharge fan arranged in the casing. In this case, a plurality of discharge fans can be arranged in the vertical direction in the casing.

In the case where the casing is divided into the above-described first and second chambers, the plurality of discharge fans are preferably arranged in the vertical direction in the second chamber. The discharge fan is arranged in a direction rotated in a horizontal plane, for example. In this case, the plurality of discharge fans may be arranged so that the discharge fans located at the upper portion guide the gas upwards and the discharge fans located at the lower portion guide the gas downwards. By such a structure, the length of the discharge path is reduced. Therefore, a fan of low power can be used.

Preferably, the conveyer base includes a rotation mechanism to rotate the arm by a predetermined angle in a horizontal plane. As described above, the casing with the elevation mechanism and the discharge means located inside is provided in a pair with the convey inlet therebetween in a preferable embodiment. By such a structure, the elevation mechanism is separated from the rotation mechanism, so that the elevation mechanism will not be rotated. Therefore, the arrangement of the wiring for the power and control of the elevation mechanism can be effected easier.

Typically, the processing unit includes a plurality of units arranged in a stacked manner in a plurality of stages. The processing unit includes a shutter to open/close the conveyer inlet, for example.

In another embodiment of the present invention, the casing includes a wall facing the conveyer inlet, and a wall not facing the conveyer inlet. The opening is formed at the wall that does not face the conveyer inlet. By such a structure, particles, even if generated in the casing, will not easily enter through the conveyer inlet since the opening is located distant from the conveyer inlet.

According to a further embodiment of the present invention, the support member includes a vent path to guide the particles generated in the conveyer base to the casing. Particles generated at, for example, the rotation mechanism of the arm are attracted into the casing via the vent path of the support member to be discharged outside. The support member has, for example, a hollow configuration.

According to another aspect of the present invention, a substrate processing apparatus includes a processing unit applying a process on a substrate carried into a processing vessel through a substrate conveyer inlet, a conveyer base provided to face the conveyer inlet, and having an arm that can move forward and backward to deliver the substrate with respect to the processing unit through the conveyer inlet, a casing having an opening elongated in the vertical direction, a support member extending inside and outside the casing through the opening to support the conveyer base outside the casing, an elevation mechanism provided in the casing to move the support member in an up and down direction, and gas supply means producing a gas flow at a position facing the conveyer inlet to prevent particles from entering the processing unit through the conveyer inlet.

According to such a structure, purge gas, for example, can be supplied towards the conveyer inlet of the processing unit to form a gas curtain. The gas curtain functions as a barrier to the atmosphere outside the substrate conveyer inlet. Therefore, contamination when the substrate is carried into the processing unit can be prevented. Also, intrusion of particles into the processing unit through the conveyer inlet can be prevented.

The processing unit includes a shutter to open/close the conveyer inlet, for example. The gas supply means supplies gas when the shutter opens for the delivery of a substrate between the arm and the processing unit. The gas supply means includes, for example, a gas blow outlet at left and right positions with the conveyer inlet therebetween. Gas is blown out from the left and right gas blow outlets in a direction towards each other.

In an embodiment, the processing unit includes a plurality of units stacked in a plurality of stages. The gas supply means includes a gas supply tube extending from a position corresponding to the bottommost unit to the position corresponding to the topmost unit. The gas supply tube includes a gas eject hole at a position corresponding to the conveyer inlet of each unit.

The processing unit includes, for example, a plurality of units stacked in a plurality of stages. The gas supply means is provided independent of each unit. In this case, each unit preferably includes a shutter that opens/closes the conveyer inlet. Each gas supply means supplies gas only when the shutter of the corresponding unit is open.

The casing includes, for example, a wall facing the conveyer inlet, and a wall not facing the conveyer inlet. The opening is formed at the wall that does not face the conveyer inlet.

A substrate processing method of the present invention employs a substrate processing apparatus including a processing unit applying a process on a substrate carried into a processing vessel via a substrate conveyer inlet, a conveyer base provided to face the conveyer inlet, and having an arm that can move forward and backward to deliver a substrate with respect to the processing unit through the conveyer inlet, a casing having an opening elongated in the vertical direction, a support member extending inside and outside the casing through the opening to support the conveyer base outside the casing, and an elevation mechanism provided in the casing to move the support member upward and downward. In one aspect, the substrate processing method includes the steps of delivering a substrate between the conveyer base and the processing unit by the arm passing through the conveyer inlet, attracting the gas in the proximity of the opening of the casing into the casing, and discharging the gas in the casing.

According to another aspect, the substrate processing method includes the steps of delivering a substrate between the conveyer base and the processing unit by the arm passing through the conveyer inlet, and supplying gas to a position facing the conveyer inlet to produce a flow of gas preventing intrusion of particles into the processing unit through the conveyer inlet.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
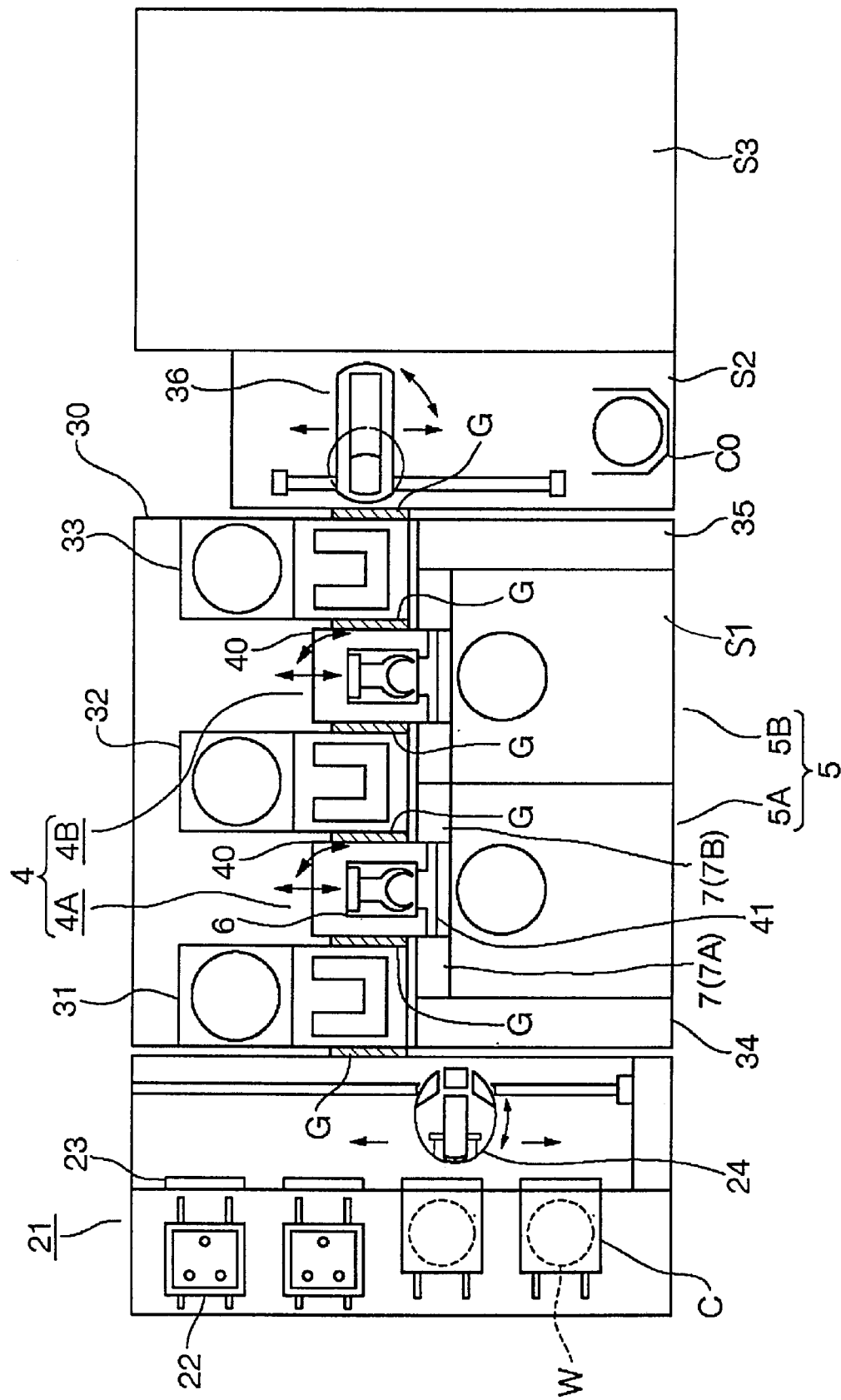
FIG. 1 is a plan view of a substrate processing apparatus according to an embodiment of the present invention.
Figure 2:
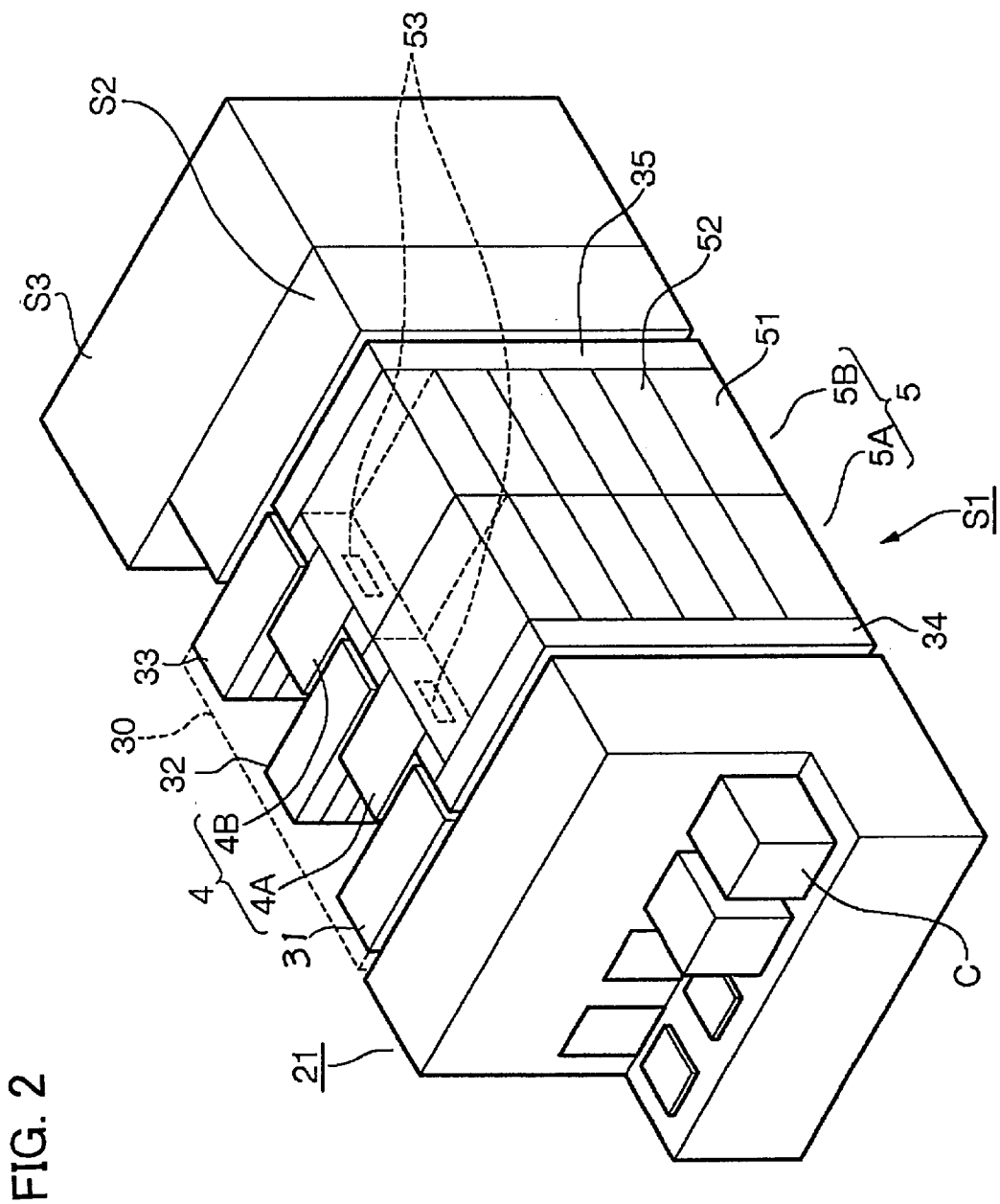
FIG. 2 is a perspective view of the substrate processing apparatus of one embodiment.

Referring to FIGS. 1 and 2, a pattern formation apparatus to form a predetermined resist pattern on a wafer W which is the substrate to be processed will be described hereinafter as an example.

In FIGS. 1 and 2, 21 designates a cassette station to transfer a cassette C in which thirteen, for example, wafers W are stored in a sealed manner. Cassette station 21 includes a mount unit 22 on which cassette C is mounted, a shutter unit 23 provided at the front wall plane when viewed from mount unit 22, and a deliver means 24 to take out wafer W from cassette C via shutter unit 23. At the rear side of cassette station 21, a processing unit S1 surrounded by a casing 30 is connected. This processing S1 has rack units 31, 32 and 33, in order when viewed from the front side, corresponding to the multi-stages of units of the heating and cooling systems, and a main conveyer means (4A, 4B) to deliver wafer W between respective processing units including the application and development units described afterwards provided in alternate arrangement. Specifically, rack units 31, 32, 33 and main conveyer means 4 (4A, 4B) are arranged in a row alignment when viewed from the cassette station 21 side. An opening not shown for wafer transportation is formed at each connection site G. Therefore, wafer W can be moved arbitrarily from rack unit 31 located at one end side to rack unit 33 located at the other end side in processing unit S1. Main conveyer means 4 (4A, 4B) is disposed within the cavity enclosed by a wall 40 constituted by one plane portion on the part of rack units 31, 32 and 33 arranged in the front to back direction when viewed from cassette station 21, one plane portion on the part of agent processing unit 5 (5A, 5B) at, for example, the right side, and a back side portion forming one plane at the left side.

At the area of main conveyer means 4 (4A, 4B) where rack units 31, 32 and 33 are not connected, for example, at the aforementioned right side plane portion, an agent processing unit (5A, 5B) corresponding to multi-stages of an application unit, a developer unit, and the like is provided. 34 and 35 designate temperature and humidity adjustment units including an adjuster of temperature or humidity, a pump, a duct, or the like.

Agent processing unit 5 (5A, 5B) has a processing vessel 52 in which an application device or developer device is stored, stacked in a plurality of stages, for example 5 stages, on a storage unit 51 that has the space to supply agents such as the application agent and developer agent as shown in FIG. 2, for example. At the side plane of processing vessel 52 at the main conveyer means (4A, 4B) side, a conveyer inlet 53 is formed to allow entry of a wafer conveyer arm that will be described afterwards for the input/output of wafer W. A shutter (not shown) that can be opened/closed arbitrarily is provided at conveyer inlet 53. With regards to rack units 31, 32 and 33, a wafer delivery unit, a hydropholic processing unit and the like, in addition to the heating unit and cooling unit, are allocated in 10 stages, for example, the vertical direction.

At the top and bottom of processing unit S1 (casing 30) are provided a fan filter unit (FFU) not shown and discharge means not shown, respectively, to allow a down flow of clean air. At the rear side of rack unit 33 in process unit S1, an exposure device S3 is connected via interface unit S2. Interface unit S2 includes delivery means 36 and a buffer cassette C0. Wafer W is delivered among processing unit S1, exposure device S3 and buffer cassette C0.

The structure of main conveyer means 4 (4A, 4B) which is a main part in the present embodiment will be described with main conveyer means 4A as an example. Prior to a detailed explanation, the entire structure will be described with reference to FIGS. 1 and 2. Main conveyer means 4A includes a conveyer main unit 6 that holds and transfers wafer W, and a horizontal support member 41 supporting the leading end of conveyer main unit 6 to ascend/descend in an integral manner. A longitudinal casing 7 (7A, 7B) in the vertical direction is provided at both sides of support member 41. Support member 41 is moved up and down by a driving unit provided in casing 7.

Figure 3:
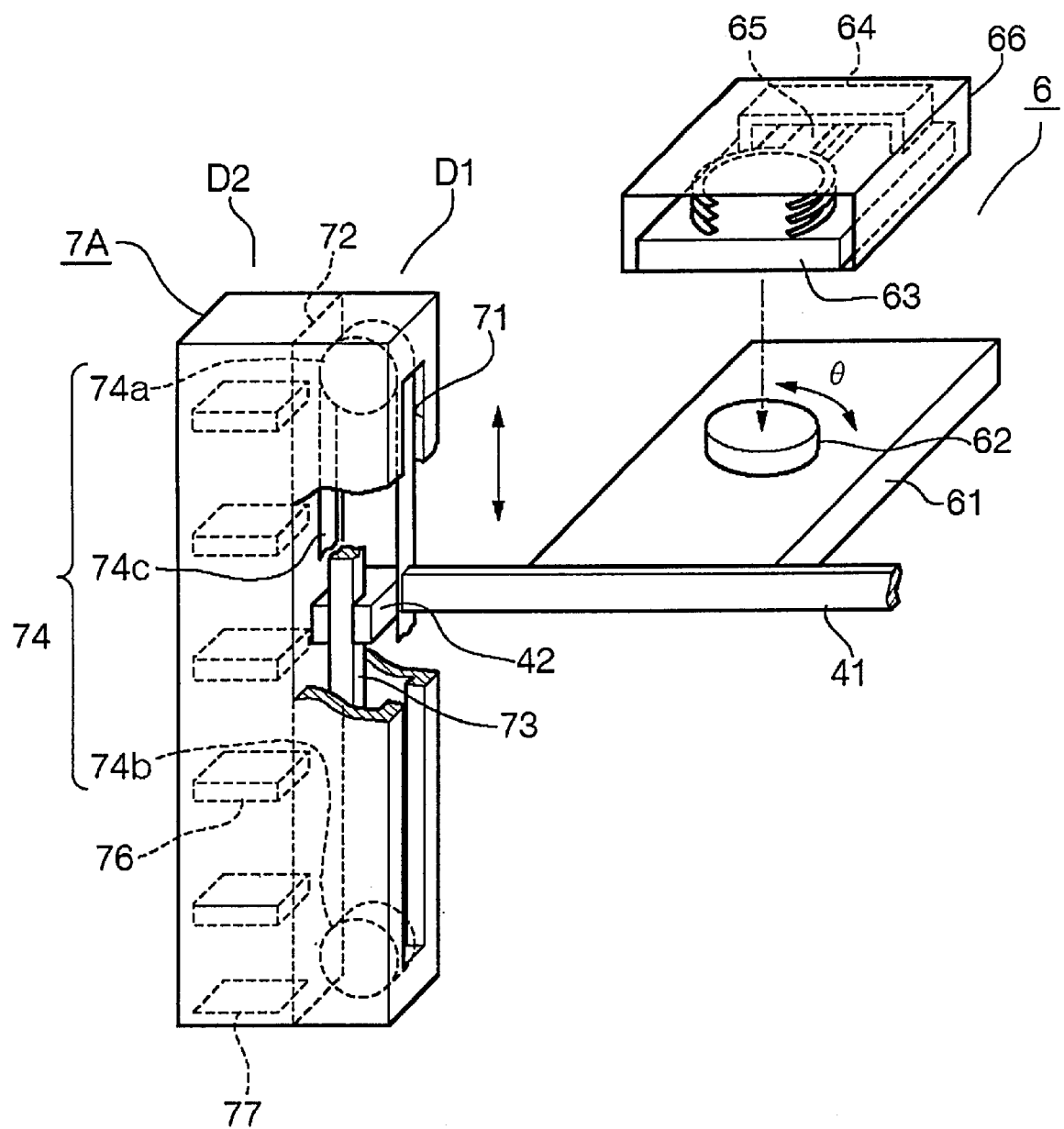
FIG. 3 is a perspective view of the entire structure of main conveyer means.

Casing 7 and conveyer main unit 6 will be described hereinafter with reference to FIGS. 3, 4 and 5. FIG. 3 is a schematic perspective view to describe main conveyer means 4. Since casing 7 (7A, 7B) is of the same configuration and arranged symmetrically when viewed from conveyer main unit 6, only casing 7A is depicted here. At the side plane of casing 7A that faces casing 7B not shown, a slit-like opening 71 elongated in the vertical direction is formed, corresponding to the moving region of support member 41, i.e., the conveying region of wafer W in the vertical direction. The interior of casing 7A is divided by a partition wall 72 into a first chamber D1 with opening 71 and a second chamber D2, located at the front side and rear side, respectively, when viewed with the side where opening 71 is formed as the front side.

In chamber D1, a guide shaft 73 that is the guiding means extending perpendicularly is provided. Guide shaft 73 is fitted with an engagement 42 that has a concave traverse cross section formed at the end portion of support member 41 to guide support member 41 in a descending and ascending manner. A driving mechanism 74 is provided in first chamber D1. Driving mechanism 74 includes pulleys 74a and 74b provided in the proximity of the ceiling and bottom of first chamber D1, respectively, and a belt 74c wound around these pulleys. Belt 74c is fixed integrally through support member 41. Therefore, when belt 74c is driven rotatably by the driving force of a motor not shown, support member 41 ascends/descends along guide shaft 73 corresponding to the movement. Each driving mechanism 74 of casings 7A and 7B is configured to rotate in synchronization with each other. Therefore, the "elevation mechanism" in the present invention includes respective driving mechanism 74 and guide shaft 73 of casings 7A and 7B in the present embodiment.

Figure 4:
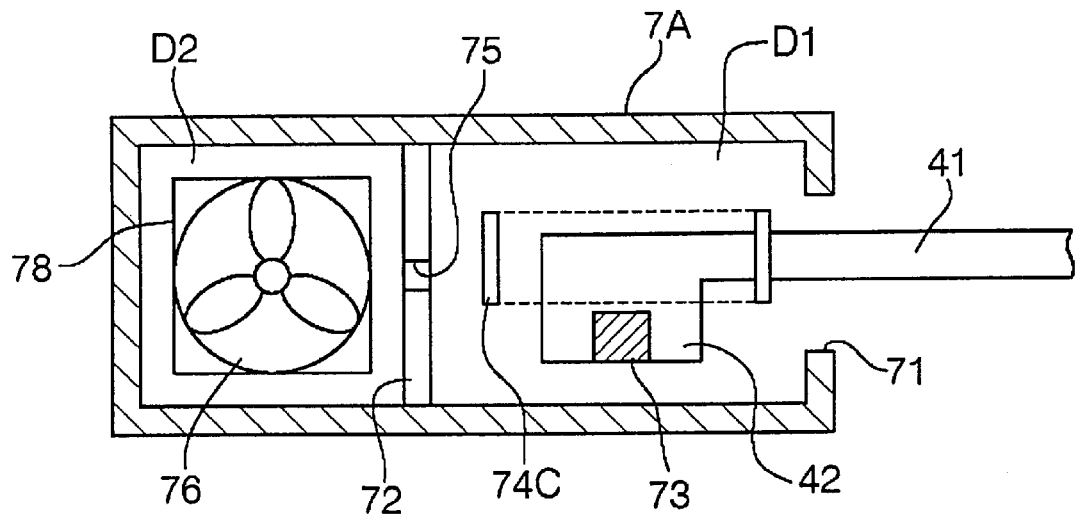
FIG. 4 is transverse cross section view to describe the interior of a casing.
Figure 5:
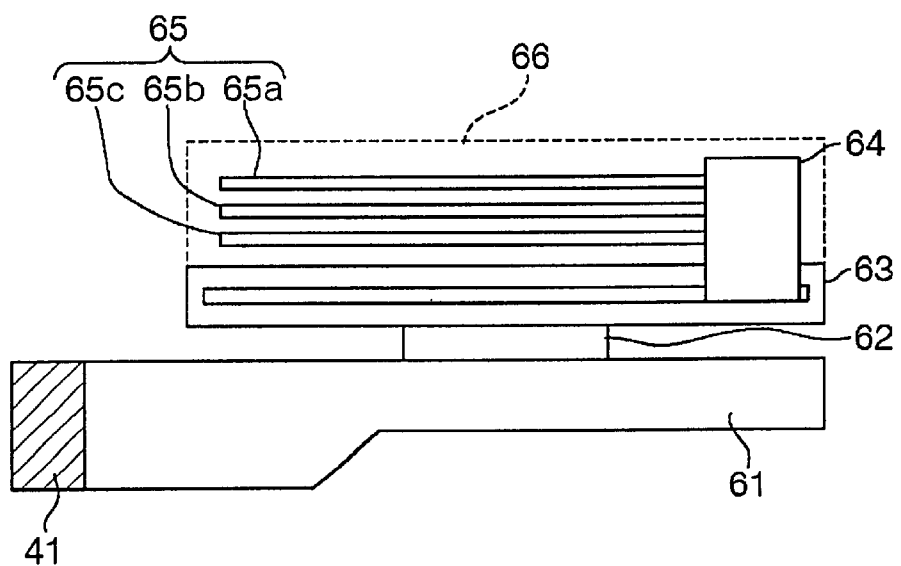
FIG. 5 is a vertical sectional view to describe a conveyer main unit.

FIG. 4 is a transverse cross sectional view showing the interior of casing 7A. At partition wall 72 that divides first and second chambers D1 and D2, a hole portion 75 constituting a slit-like vent hole smaller in width than opening 71 is formed over a length corresponding to the vertical travel region of support member 41 along guide shaft 73.

In second chamber D2, a plurality of stages of fan 76, each rotating horizontally, are arranged in multi-stages at equal distance. Fan 76, the details of which will be described in detail afterwards, is the discharge means to discharge the atmosphere of first chamber D1 outside casing 7 (7A) via hole 75. At the bottom of second chamber D2, a discharge outlet 77 for this discharge is provided.

Figure 6:
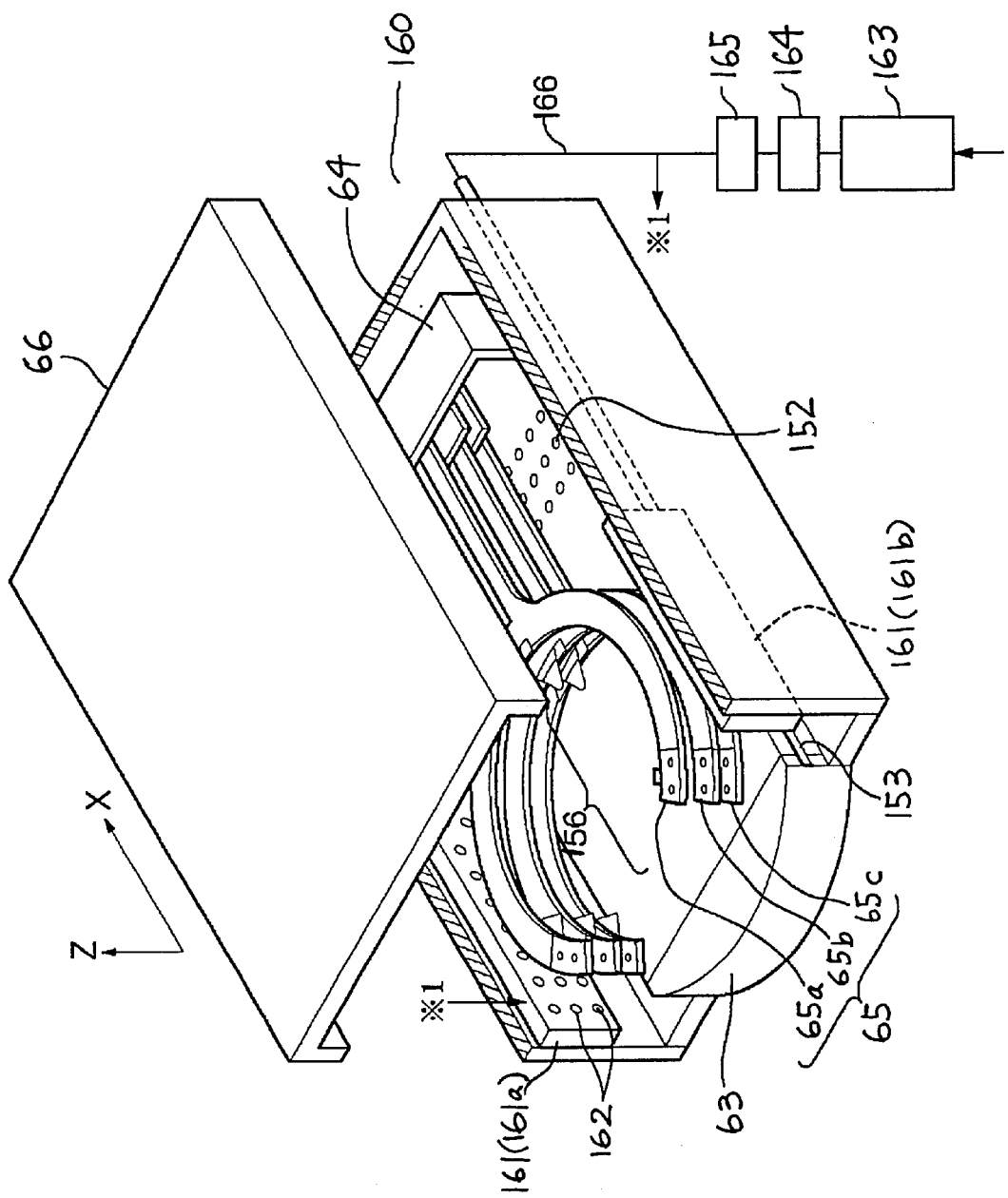
FIG. 6 is a perspective view to describe a structure of the conveyer main unit.
Figure 7:
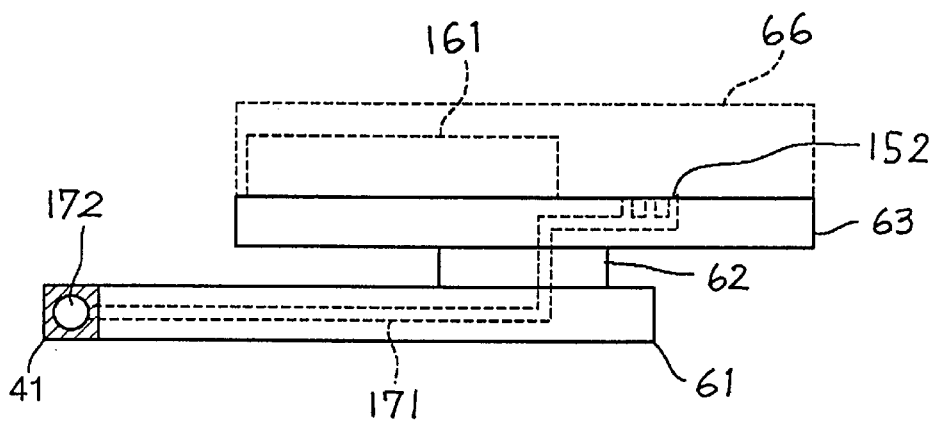
FIGS. 7 and 8 are schematic vertical cross sectional views to describe a discharge path of a discharge hole provided at the conveyer main unit, respectively.

Conveyer main unit 6 will be described hereinafter with reference to FIGS. 3, 5, 6, 7 and 8. As shown in FIG. 3, conveyer main unit 6 is provided to allow θ rotation about a vertical axis on an elevation base 61 via rotation mechanism 61. Elevation base 61 has its leading end fixed to support member 41. Conveyer main unit 6 ascends/descends integrally with support member 41. At the surface of the plate of conveyer base 63 forming the bottom of conveyer main unit 6, a discharge outlet 152 including a plurality of holes is formed at the back side of an arm (described afterwards), when viewed from the forward moving direction of the arm as shown in FIG. 6. Also, a guide trench 53 extending in the X direction is provided at both side planes of conveyer base 63 so as to be in parallel, for example.

64 designates an arm support unit, configured to support three arms 65 (65a, 65b, 65c) which are the substrate deliver means above conveyer base 63, and move a selected one of the these arms 65 (65a, 65b, 65c) along guide groove 153. In FIG. 6, arm 65 (65a, 65b, 65c) lies in a retreating position. The aforementioned discharge outlet 152 is positioned backward of a wafer hold region 156 enclosed by the horseshoe-shaped region of arm 65 (65a, 65b, 65c) at the retreating position.

In the delivery operation of wafer W, arm support unit 64 located at the trailing end of conveyer base 63 in FIG. 6 moves forward to the proximity of the leading end of conveyer base 63. Wafer hold region 156 ahead of one arm 65 (65a, 65b, 65c) proceeds to the delivery destination of wafer W such as agent processing unit 5.

Above conveyer base 63 is provided a cover 66 to cover arm support unit 64 and arm 65 (65a, 65b, 65c) in order to compart wafer hold region 152 from the outside atmosphere at the retreating movement of arm 65 (65a, 65b, 65c) to maintain an atmosphere of a predetermined temperature and humidity. Conveyer base 63 and cover unit 66 constitute case body 160. Case body 160 encloses arm 65 (65a, 65b, 65c) with the front plane side open to allow the forward and backward movement of arm 65 (65a, 65b, 65c). At the inner wall plane of case unit 160, a gas supply unit 161 (161a, 161b) of, for example, a panel configuration, is provided so as to sandwich wafer hold region 156 of arm 65 (65a, 65b, 65c) at the retreating position from both the left and right sides. Gas supply unit 161 (161a, 161b) has a plurality of gas supply holes 162 formed along the length of wafer hold region 156 in the front and back direction and corresponding to the height position of each stage of arm 65 (65a, 65b, 65c) so as to allow gas supply to wafer hold region 156 of each arm 65 (65a, 65b, 65c).

At the trailing end of gas supply unit 161 (161a, 161b), a gas supply tube 166 formed of, for example, a flexible tube, is connected, arranged from an adjustment unit 163 provided above processing unit S1 (casing 30) via a fan 164 and a cleaning filter 165 to remove particles. Adjustment unit 163 serves to introduce the air (external air) in the plant, for example, adjust the temperature thereof, and supply the same into case unit 160. For example, adjustment unit 163 is configured to cool down the input air first to a temperature less than 0° C., apply humidification to attain a predetermined humidity, and heat the same to a predetermined temperature with a heater. The adjusted air is delivered through fan 164, purged by cleaning filter 165, and then supplied into case unit 160.

Figure 8:
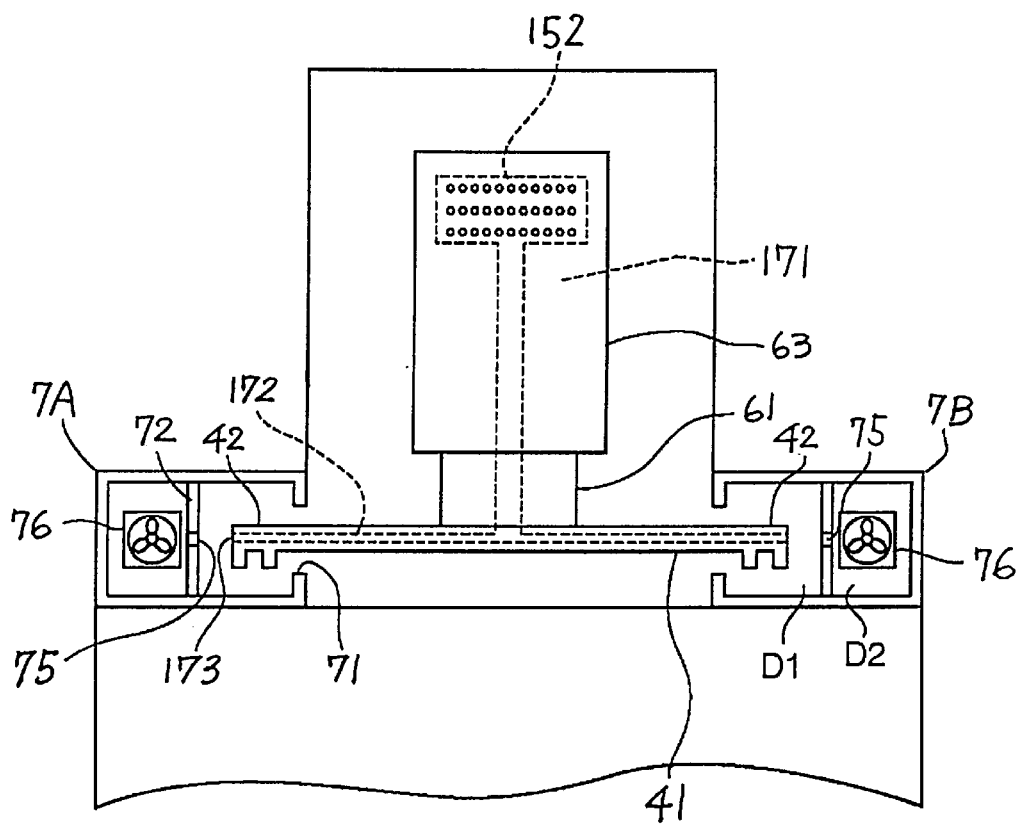

Discharge outlet 52 is provided to absorb the internal atmosphere in case unit 160 to form an air flow from the forward side towards the backward side. The discharge side in connection with discharge outlet 152 will be described hereinafter with reference to FIGS. 7 and 8. Downstream of discharge outlet 152, a flow path 171 communicating through the interior of conveyer base 63, rotation mechanism 62 and elevation base 61 is formed. This flow path 171 communicates with a hollow portion 172 formed in support member 41. Although not depicted in FIG. 3, hollow portion 172 is formed to pierce the interior of support unit 41 in the longitudinal direction. A hole 173 located at both ends of hollow portion 172 is formed at the perpendicular plane of engagement unit 42 facing partition wall 72. Since discharge outlet 152 leads to first chamber D1 via air path 171 and hollow portion 172, discharge at first chamber D1 also causes absorption at discharge outlet 152 at the same time. As shown in FIG. 8, since a second opening 75 of a slit configuration extending vertically corresponding to the ascending/descending region of support member 41 is formed at partition wall 72, discharge at second chamber D2 causes absorption of the atmosphere at first chamber D1 via second opening 75. Flow path 171 and hollow portion 172 corresponds to the discharge path.

The function of the present embodiment will be described here. Upon delivery of cassette C to cassette station 21, the lid of cassette C is removed together with shutter 23, and wafer W is taken out through deliver means 24. Wafer W is transferred from deliver means 24 to main conveyer means 4A via a delivery unit (the unit where the mount is placed) in rack unit 31, and applied with the resist agent by the application device in, for example, agent processing unit 5A. Then, wafer W is transferred from main conveyer means 4A through the delivery unit of rack unit 32, main conveyer means 4B, the delivery unit of rack unit 33, and deliver means 36 of interface unit S2 to exposure device S3 where exposure is effected. Prior to the application of a resist on wafer W, a hydrophobic process and a cooling process, for example, are carried out at the processing units in rack units 31, 32 and 33. After the resist is applied, wafer W is subjected to a heating process and a cooling process. Following the exposure process, wafer W is transferred to main conveyer means 4A in an opposite route, and developed at the development unit in agent processing unit 5A. Thus, a predetermined resist pattern is formed. Before and after the developing process, preprocessing and post-processing such as heating and cooling are carried out at rack units 31, 32 and 33.

Figure 9:
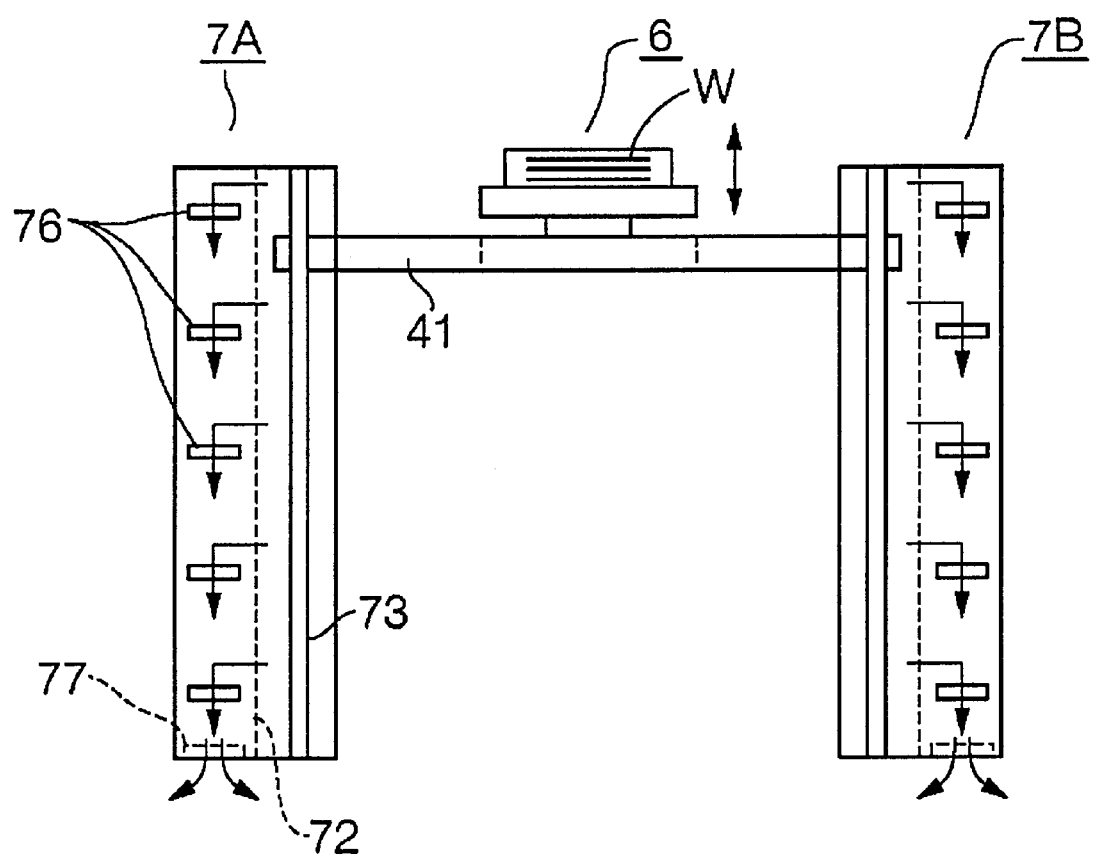
FIG. 9 is a diagram to describe the function of an embodiment of the present invention.

Description here is focused on casing 7 (7A, 7B) as to the function in the transportation of wafer W with main conveyer means 4A as an example. When support member 41 ascends/descends by the function of guide shaft 73 and driving mechanism 74 in casing 7 (7A, 7B), fan 76 is constantly operating in second chamber D2 to form a downward flow towards discharge outlet 77. As shown in FIG. 9, the atmosphere in first chamber D1 is drawn towards second chamber D2 via hole 75 to flow together with the downward flow in second chamber D2 to discharge outlet 77, and then discharged out of the substrate processing apparatus main unit, i.e., downwards of casing 30 to the atmosphere outside where wafer W is placed.

During the rotation of fan 76, an air flow from opening 71 to hole 75 is formed in first chamber D1. Therefore, the particles present in first chamber D1 will not flow out from opening 71. When conveyer main unit 6 descending/ascending in such a circumstance arrives at the height of the unit of interest, wafer W is delivered by one arm 65 selected by a control unit not shown. Specifically, taking agent processing unit 5A as an example, the shutter not shown of conveyer inlet 53 opens, and arm 66 enters processing vessel 52 where the application unit is provided in accordance with the travel of arm support member 64.

According to the above-described embodiment, the interior of casing 7 (7A, 7B) enclosing the elevation mechanism of conveyer main unit 6 is divided by a partition wall 72 where slit hole 75 is formed, and the atmosphere of first chamber D1 where guide shaft 73 is located is drawn towards second chamber D2 via hole 75. Therefore, almost no particles generated when support member 41 is rubbed against engagement unit 42 and guide shaft 73 during the ascend/descend of support member 41 or when driving mechanism 75 is driven will not flow out from opening 71 towards the front side. Therefore, arm 65 can carry out delivery of wafer W under a clean environment.

The configuration of hole 75 formed at partition wall 72 in the present embodiment is not limited to a slit. A plurality of holes at the height corresponding to respective fans 76 can be provided. Alternatively, a plurality of small holes can be formed all over the plane. Furthermore, the discharge air flow can be facilitated by setting the rotating speed of the fan as a function of location at a lower position for each stage of fan 76. In the illustrated embodiment, all the fans 76 are set so as to guide the gas downwards. As a modification, the plurality of discharge fans may be arranged so that the discharge fans located at the upper portion guide the gas upwards whereas the discharge fan located at the lower portion guide the gas downwards. Accordingly, the length of the discharge path will become shorter to allow the usage of a fan of lower power.

Figure 10:
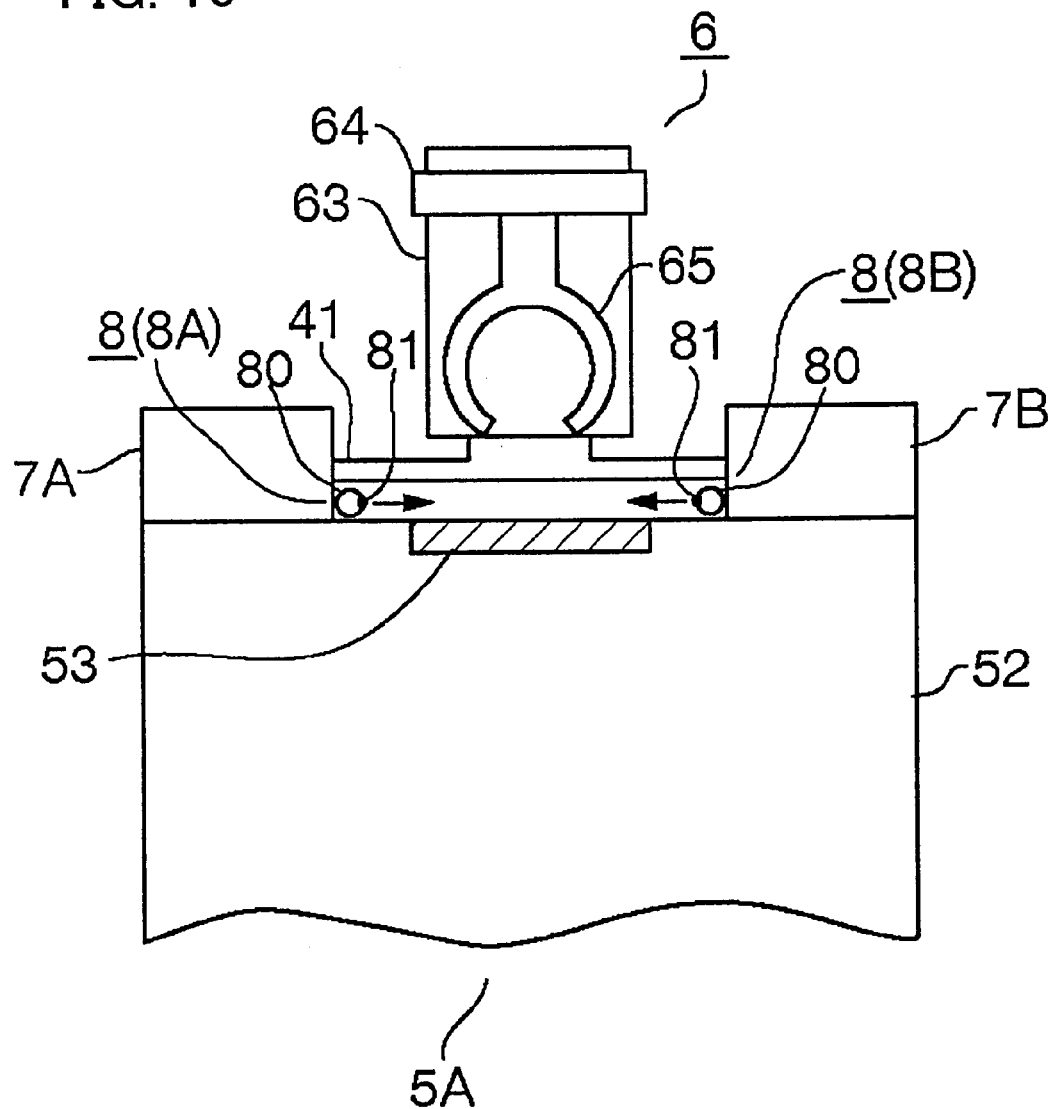
FIG. 10 is a schematic diagram showing another embodiment of the present invention.
Figure 11:
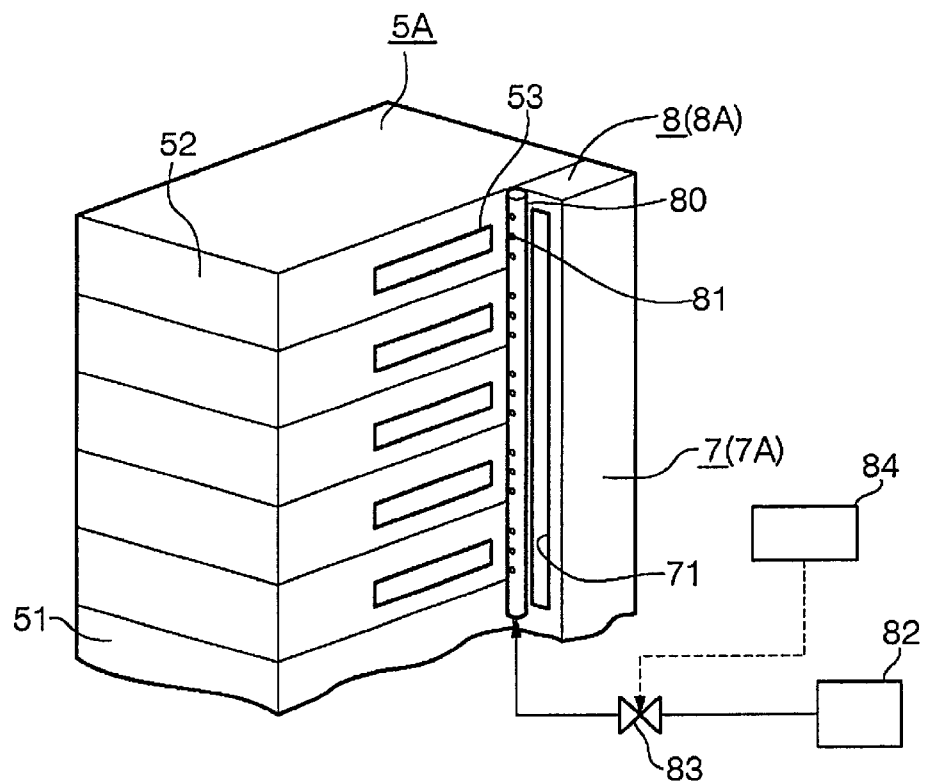
FIGS. 11 and 12 are schematic diagrams showing further embodiments of the present invention.

The present invention can suppress the affect of particles towards wafer W during transportation also by a second embodiment set forth below. In the second embodiment, gas supply means 8 (8A, 8B) is provided to sandwich conveyer outlet 53, as shown in FIG. 10, for example, when main conveyer means 4A similar to that of the previous embodiment is used. Gas supply means 8 (8A, 8B) has a plurality of gas eject holes 81 formed along a vertical, for example, gas supply tube 80. Each gas eject hole 81 is arranged to face each other. Gas supply means 8 (8A, 8B) supplies purge gas, for example inert gas such as nitrogen, from gas eject hole 81 when a shutter not shown provided at conveyer inlet 53 opens for the entry of arm 65. A plurality of gas eject holes 81 are provided at a position corresponding to the height of conveyer inlet 53 of each processing vessel 52 constituting at least agent processing unit 5A as shown in FIG. 11. At the proximal end side of gas supply tube 80, a gas supply source 82 is connected. The supply of gas is turned on/off through the control of a control unit 84 by opening/closing a valve 83 provided at gas supply tube 80. The purge gas may be supplied constantly irrespective of the opening/closure of the shutter.

By such a structure, the purge gas supplied in the proximity of the opening when conveyer inlet 53 (shutter) is open forms the so-called air curtain to act as a barrier with respect to the atmosphere external to the purge gas supply region. Therefore, the possibility of wafer W being contaminated at the time of entry into agent processing unit 5A is low.

Figure 12:
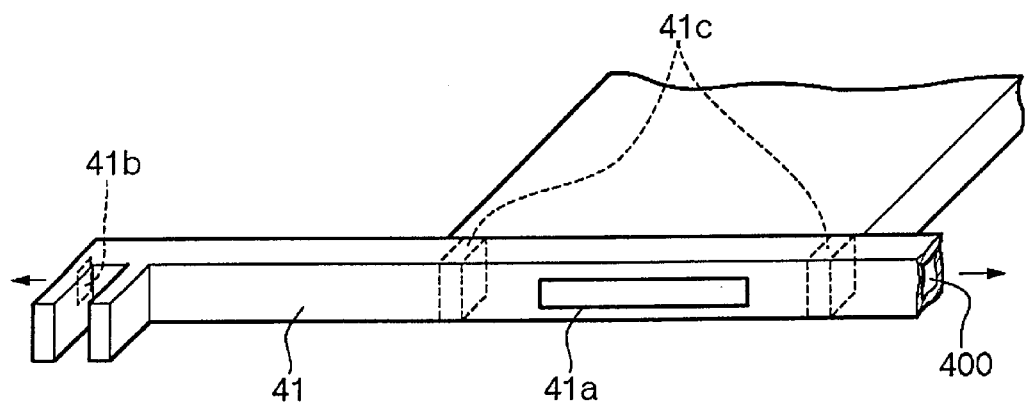

By forming support member 41 as a hollow member, as shown in FIG. 12 in the second embodiment, the effect of preventing wafer W from contamination can be improved. In this example, a flow path 400 penetrating the interior of support member 41 is formed in the longitudinal direction. This flow path 400 communicates with an attraction opening 41a formed at the middle of the side plane of support member 41, facing conveyer inlet 3 of processing vessel 52. In the passage of flow path 400, two fans 41c are arranged so as to sandwich attraction opening 41a. The two fans 41c provide air flow in opposite directions, i.e. towards respective openings 41b located at both ends of flow path 400.

Figure 13:
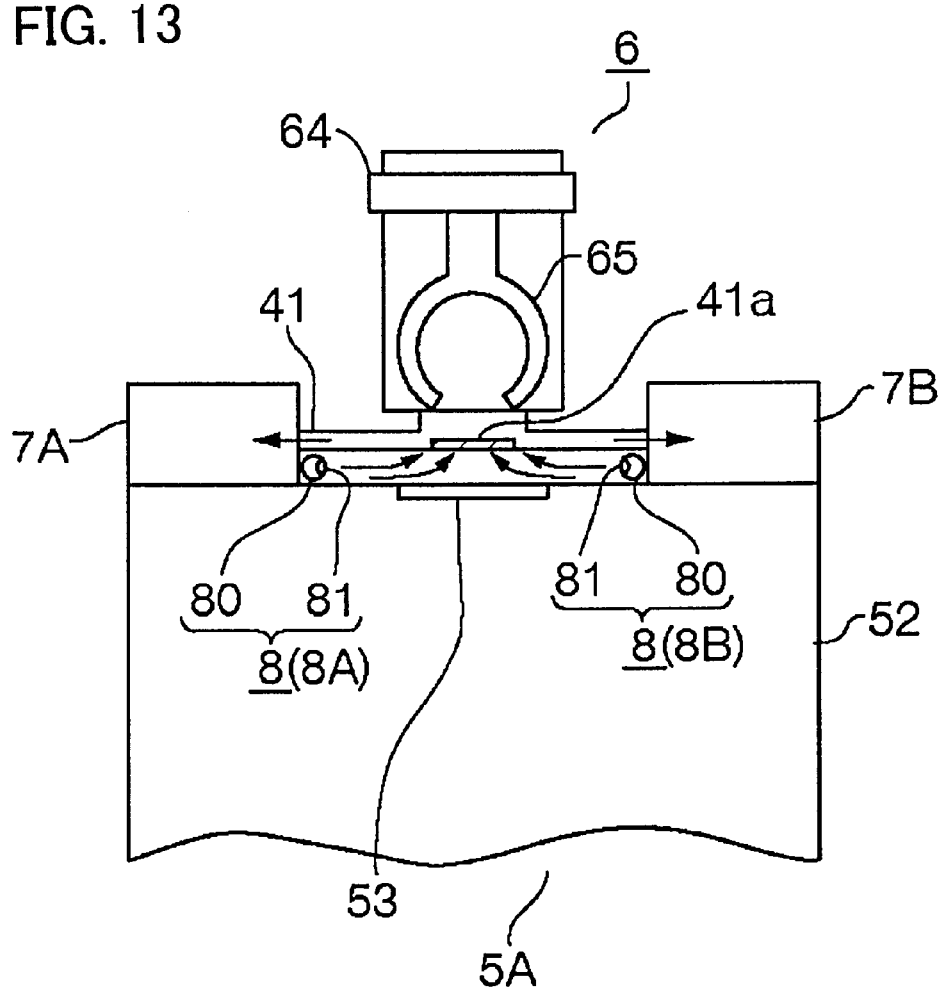
FIG. 13 is a diagram to describe the function of the embodiment of FIG. 12.

In such an apparatus, the supply of purge gas from gas supply means 8 (8A, 8B) together with the drive of fan 41c causes the atmosphere in front of attraction hole 41a to be drawn into casing 7 (7A, 7b) via flow path 400 as shown in FIG. 13, whereby the purge gas forms a flow towards attraction hole 41a. The purge gas functions as a barrier with respect to the atmosphere outside the conveyer region of wafer W as well as to remove fine particles from the conveyer region. Therefore, wafer W can be transferred to the agent processing unit in a cleaner state.

Figure 14:
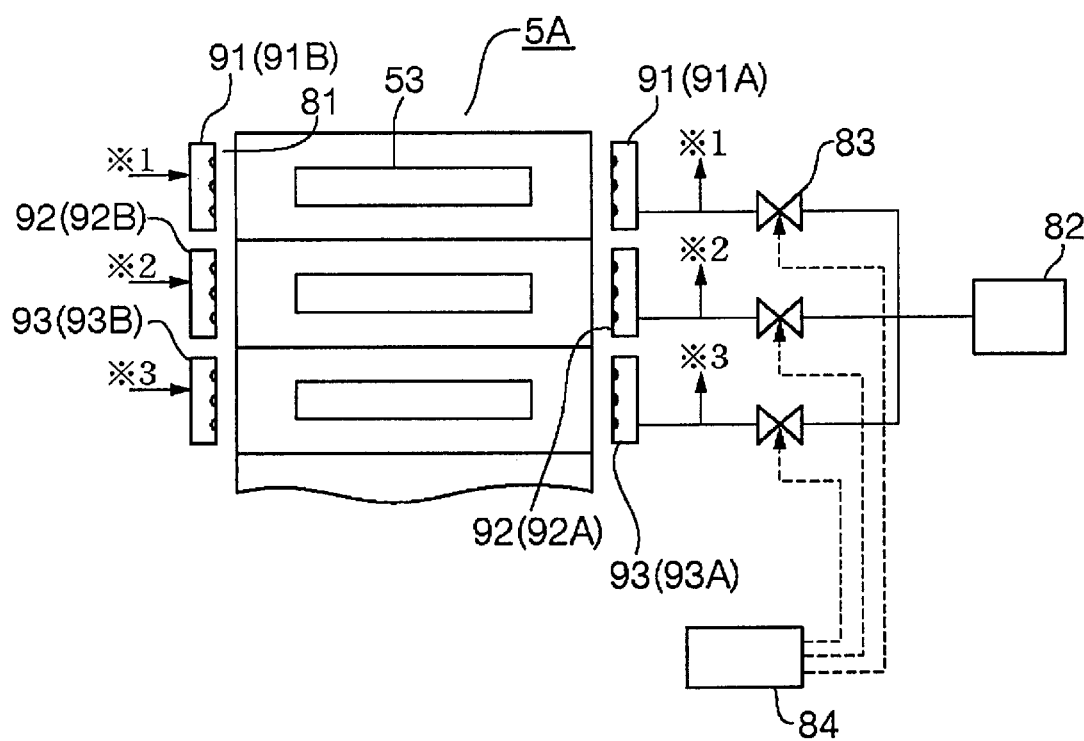
FIGS. 14 and 15 are schematic diagrams showing still another embodiment of the present invention.

The interior of processing unit S1 is maintained at a predetermined positive pressure. This means that there is a possibility of the pressure of the wafer conveyer hall being affected if the amount of the ejected purge gas is great. However, the present embodiment has gas supply means 91 (91A, 91B), 92 (92A, 92B), 93 (93A, 93B) provided for each stage of agent processing unit 5A, as shown in FIG. 14. Also, the opening/closure of each valve 83 is controlled by the aforementioned control unit 84. For example, when a shutter not shown that blocks conveyer inlet 53 is opened, gas is supplied only through the gas supply means corresponding to the relevant conveyer inlet 53 to reduce the effect on the pressure towards processing unit S1.

Figure 15:
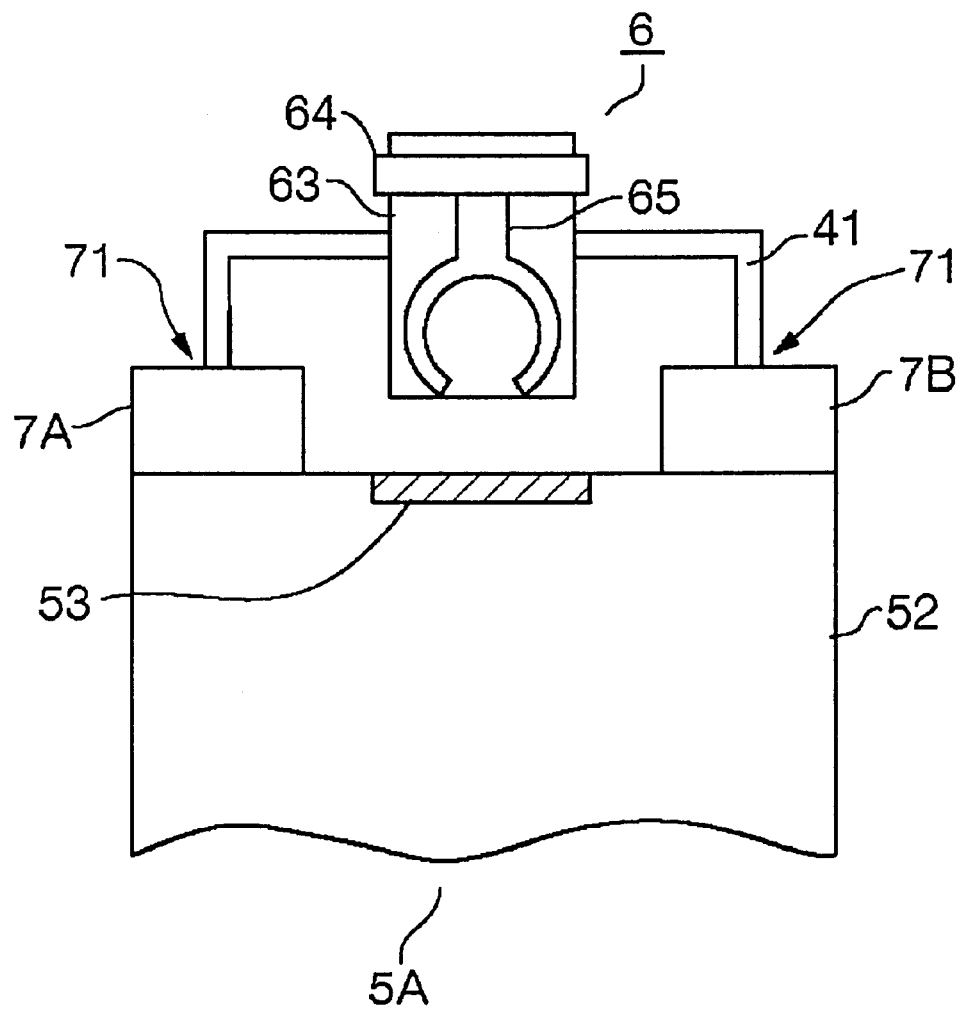
Figure 16:
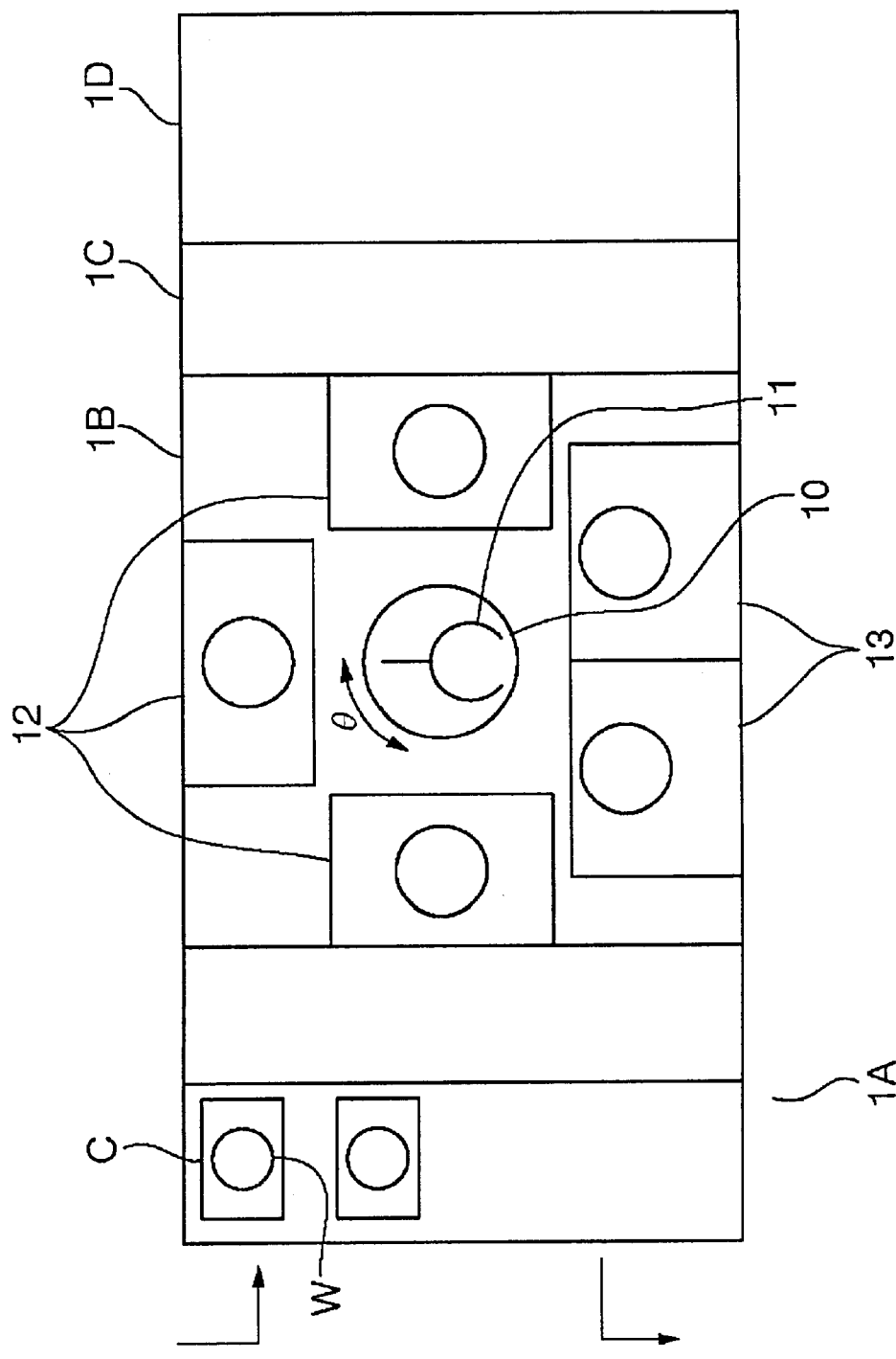
FIG. 16 is a plan view of a conventional substrate processing apparatus.
Figure 17:
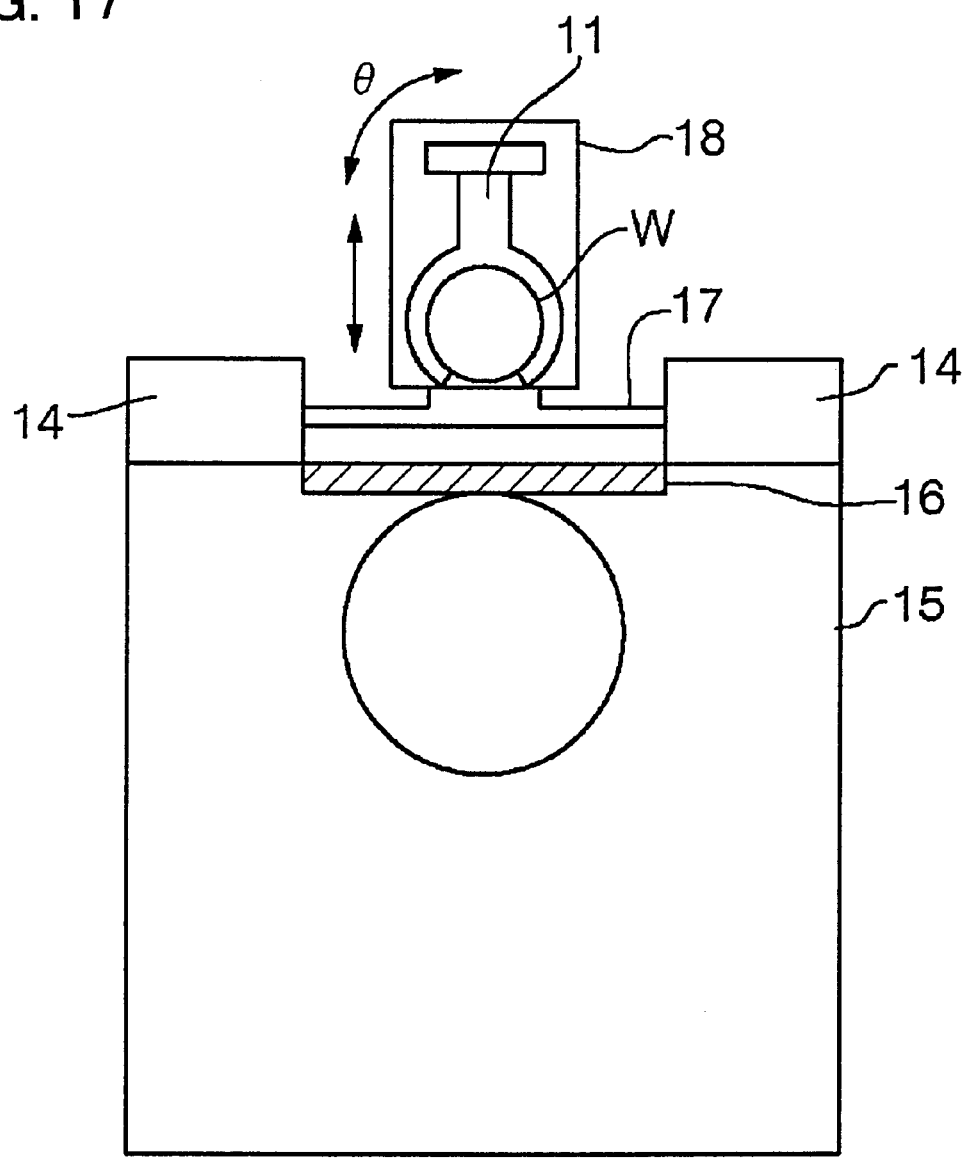
FIG. 17 is a plan view of an example of wafer conveyer means.

In the previous embodiment, contamination of the region of travel of arm 66 is obviated by providing discharge outlet 77 at a position remote from opening 71. Alternatively, opening 71 can be formed at a side plane remote from conveyer inlet 53, and provide support member 41 in a bent manner of an L shape, as shown in FIG. 15. While this feature can be employed alone, the combination of this feature with the first or second embodiment will provide the advantage that the effect is improved.

Although the present embodiment has been described taking an application device and developer device forming a predetermined resist pattern on the surface of semiconductor wafer as an example, the present invention is not limited to such a case. For example, the present invention can be applied to an apparatus that applies and heats organic type silica on the surface of a substrate to form a glass film, and incorporate the above-described embodiment into the site where the substrate is delivered to a silica application unit corresponding to the agent processing unit. Furthermore, the substrate is not limited to a wafer, and may be an LCD substrate or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus comprising:
   a processing unit applying a process on a substrate carried into a processing vessel through a substrate conveyer inlet,
   a conveyer base provided so as to face said conveyer inlet, and having an arm that can move forward and backward to transfer a substrate with respect to said processing unit through said conveyer inlet,
   a casing having an opening elongated in a vertical direction,
   a support member extending inside and outside said casing through said opening to support said conveyer base outside said casing,
   an elevation mechanism provided in said casing to move said support member upward and downward, and
   discharge means for discharging gas in said casing.

2. The substrate processing apparatus according to claim 1, wherein
   said casing includes a first chamber and a second chamber divided by a partition wall having a vent hole, said first chamber having said opening,
   said elevation mechanism is disposed in said first chamber, and
   said discharge means is disposed in said second chamber.

3. The substrate processing apparatus according to claim 2, wherein
   said partition wall is a perpendicular wall extending in a vertical direction, and
   said vent hole is a vertically elongated slit having a length corresponding to the length of vertical travel of said support member.

4. The substrate processing apparatus according to claim 1, wherein said discharge means comprises a discharge fan disposed in said casing.

5. The substrate processing apparatus according to claim 1, wherein said discharge means comprises a plurality of discharge fans provided in a plurality of stages vertically in said casing.

6. The substrate processing apparatus according to claim 2, wherein said discharge means comprises a plurality of discharge fans provided in a plurality of stages vertically in said second chamber.

7. The substrate processing apparatus according to claim 6, wherein said discharge means comprises a discharge fan rotating in a horizontal plane.

8. The substrate processing apparatus according to claim 7, wherein upper-located discharge fans and lower-located discharge fans among said plurality of discharge fans guide gas upwards and downwards, respectively.

9. The substrate processing apparatus according to claim 1, wherein said conveyer base includes a rotation mechanism to rotate said arm by a predetermined angle within a horizontal plane.

10. The substrate processing apparatus according to claim 1, wherein one pair of said casing having said elevation mechanism and said discharge means inside is provided sandwiching said conveyer inlet.

11. The substrate processing apparatus according to claim 1, wherein said processing unit comprises a plurality of units stacked in a plurality of stages.

12. The substrate processing apparatus according to claim 1, wherein said processing unit includes a shutter that opens and closes said conveyer inlet.

13. The substrate processing apparatus according to claim 1, wherein
    said casing comprises a wall facing said conveyer inlet, and a wall not facing said conveyer inlet,
    said opening is formed at the wall that does not face said conveyer inlet.

14. The substrate processing apparatus according to claim 1, wherein said support member includes a vent path to guide particles generated in said conveyer base to said casing.

15. A substrate processing apparatus comprising:
    a processing unit applying a process on a substrate carried into a processing vessel through a substrate conveyer inlet,
    a conveyer base provided so as to face said conveyer inlet, and having an arm that can move forward and backward to transport a substrate with respect to said processing unit through said conveyer inlet,
    a casing having an opening elongated in a vertical direction,
    a support member extending inside and outside said casing through said opening to support said conveyer base outside said casing,
    an elevation mechanism provided in said casing to move said support member upwards and downwards, and
    gas supply means for producing a flow of gas at a position facing said conveyer inlet to prevent particles from entering said processing unit through said conveyer inlet.

16. The substrate processing apparatus according to claim 15, wherein
    said processing unit comprises a shutter that opens and closes said conveyer inlet,
    said gas supply means supplies gas when said shutter is opened and a substrate is transferred between said arm and said processing unit.

17. The substrate processing apparatus according to claim 15, wherein
    said gas supply means comprises a gas blow outlet at a right position and a left position with said conveyer inlet therebetween, and
    gas is blown out from said left and right gas blow outlets towards each other.

18. The substrate processing apparatus according to claim 15, wherein
    said processing unit comprises a plurality of units stacked in a plurality of stages, said gas supply means comprises a gas supply tube extending from a position corresponding to said unit at a bottommost stage to a position corresponding to said unit at a topmost stage, said gas supply tube includes a gas eject hole at a position corresponding to the conveyer inlet of each said unit.

19. The substrate processing apparatus according to claim 15, wherein said processing unit comprises a plurality of units stacked in a plurality of stages, said gas supply means is provided independently for each said unit.

20. The substrate processing apparatus according to claim 19, wherein said each of said plurality of units comprises a shutter that closes and opens said conveyer inlet, said each gas supply means supplies gas only when the shutter of a corresponding unit is open.

21. The substrate processing apparatus according to claim 15, wherein said casing comprises a wall facing said conveyer inlet and a wall not facing said conveyer inlet, said opening is formed at the wall that does not face said conveyer inlet.

22. A substrate processing method employing a substrate processing apparatus including a processing unit applying a process on a substrate carried into a processing vessel through a substrate conveyer inlet, a conveyer base provided so as to face said conveyer inlet, and having an arm that can move forward and backward arbitrarily to transfer a substrate with respect to said processing unit through said conveyer inlet, a casing having an opening elongated in a vertical direction, a support member extending inside and outside said casing through said opening to support said conveyer base outside said casing, and an elevation mechanism provided in said casing to move said support member upward and downward, said substrate processing method comprising the steps of:

transferring a substrate between said conveyer base and said processing unit through said arm passing through said conveyer inlet, absorbing gas in a neighborhood of the opening of said casing into said casing, and discharging the gas in said casing.

23. A substrate processing method employing a substrate processing apparatus including a processing unit applying a process on a substrate carried into a processing vessel through a substrate conveyer inlet, a conveyer base provided so as to face said conveyer inlet, and having an arm that can move forward and backward arbitrarily to transfer a substrate with respect to said processing unit through said conveyer inlet, a casing having an opening elongated in a vertical direction, a support member extending inside and outside said casing through said opening to support said conveyer base outside said casing, and an elevation mechanism provided in said casing to move said support member upward and downward, said substrate processing method comprising the steps of:

transferring a substrate between said conveyer base and said processing unit by said arm passing through said conveyer inlet, and supplying gas to a position facing said conveyer inlet to produce a flow of gas preventing intrusion of particles into said processing unit through said conveyer inlet.

* * * * *